(12) United States Patent
Ko et al.

(10) Patent No.: US 8,067,828 B2
(45) Date of Patent: Nov. 29, 2011

(54) SYSTEM FOR SOLDER BALL INNER STACKING MODULE CONNECTION

(75) Inventors: Chan Hoon Ko, Ichon si (KR); Soo-San Park, Seoul (KR)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 12/046,369

(22) Filed: Mar. 11, 2008

(65) Prior Publication Data
US 2009/0230532 A1    Sep. 17, 2009

(51) Int. Cl.
*H01L 23/48* (2006.01)
*H01L 23/02* (2006.01)

(52) U.S. Cl. . 257/686; 257/685; 257/777; 257/E23.024; 257/E21.502; 438/109

(58) Field of Classification Search ............... 257/686, 257/685, 777
See application file for complete search history.

(56) References Cited

U.S. PATENT DOCUMENTS

| | | | |
|---|---|---|---|
| 6,201,266 B1 | 3/2001 | Ohuchi et al. | |
| 6,558,978 B1 | 5/2003 | McCormick | |
| 6,762,488 B2 | 7/2004 | Maeda et al. | |
| 7,053,476 B2 | 5/2006 | Karnezos | |
| 7,061,087 B2 | 6/2006 | Kim | |
| 7,132,753 B1 | 11/2006 | St. Amand et al. | |
| 7,253,511 B2 | 8/2007 | Karnezos et al. | |
| 7,518,224 B2 | 4/2009 | Shim et al. | |
| 2005/0230801 A1* | 10/2005 | Kuroda et al. | 257/686 |
| 2006/0256525 A1 | 11/2006 | Shim et al. | |
| 2007/0001296 A1 | 1/2007 | Lee et al. | |
| 2007/0052082 A1* | 3/2007 | Lee et al. | 257/686 |
| 2007/0108581 A1* | 5/2007 | Shim et al. | 257/686 |
| 2008/0157318 A1 | 7/2008 | Chow et al. | |
| 2009/0057861 A1 | 3/2009 | Park et al. | |

* cited by examiner

*Primary Examiner* — Howard Weiss
*Assistant Examiner* — Tifney Skyles
(74) *Attorney, Agent, or Firm* — Mikio Ishimaru (57) ABSTRACT

An integrated circuit package-in-package system including: providing a substrate; mounting a structure over the substrate; supporting an inner stacking module cantilevered over the substrate by an electrical interconnect connected to the substrate, the electrical interconnect forming a gap between the inner stacking module and the structure controlled by the size of the electrical interconnect; and encapsulating the structure and inner stacking module with an encapsulation.

20 Claims, 8 Drawing Sheets

SYSTEM FOR SOLDER BALL INNER STACKING MODULE CONNECTION

CROSS-REFERENCE TO RELATED APPLICATION(S)

The present application contains subject matter related to U.S. patent application Ser. No. 11/849,087, now U.S. Pat. No. 7,812,435. The related application is assigned to STATS ChipPAC Ltd.

The present application further contains subject matter related to a co-pending U.S. Provisional Patent Application Ser. No. 60/969,600.

TECHNICAL FIELD

The present invention relates generally to an integrated circuit package system, and more particularly to an integrated circuit package-in-package system.

BACKGROUND ART

The rapidly growing portable electronics market, e.g. cellular phones, laptop computers, and PDAs, are an integral facet of modern life. The multitude of portable devices represents one of the largest potential market opportunities for next generation packaging. These devices have unique attributes which have significant impacts on manufacturing integration, in that they must be generally small, light weight, and rich in functionality and they must be produced in high volumes at relatively low cost.

As an extension of the semiconductor industry, the electronics packaging industry has witnessed ever-increasing commercial competitive pressures, along with growing consumer expectations and the diminishing opportunities for meaningful product differentiation in the marketplace.

Packaging and materials engineering and development are at the very core of these next generation electronics insertion strategies outlined in road maps for development of next generation products. Future electronic systems may be more intelligent, have higher density, use less power, operate at higher speed, and may include mixed technology devices and assembly structures at lower cost than today.

Current packaging suppliers are struggling to accommodate the high speed computer devices which are projected to exceed one TeraHertz (THz) in the near future. The current technologies, materials, equipment, and structures offer challenges to the basic assembly of these new devices while still not adequately addressing cooling and reliability concerns.

The envelope of technical capability of next generation IC package assemblies are not yet known, and no clear cost effective technology has yet been identified. Beyond the performance requirements of next generation devices, the industry now demands that cost be a primary product differentiator in an attempt to meet profit goals.

As a result, the road maps are driving electronics packaging to precision, ultra miniature form factors which require automation in order to achieve acceptable yield. These challenges demand not only automation of manufacturing, but also the automation of data flow and information to the production manager and customer.

There have been many approaches to addressing the advanced packaging requirements of microprocessors and portable electronics with successive generations of semiconductors. Many industry road maps have identified significant gaps between the current semiconductor capability and the available supporting electronic packaging technologies. The limitations and issues with current technologies include increasing clock rates, EMI radiation, thermal loads, second level assembly reliability stresses and cost.

As these package systems evolve to incorporate more components with varied environmental needs, the pressure to push the technological envelope becomes increasingly challenging. More significantly, with the ever-increasing complexity, the potential risk of error increases greatly during manufacture.

In view of the ever-increasing commercial competitive pressures, along with growing consumer expectations and the diminishing opportunities for meaningful product differentiation in the marketplace, it is critical that answers be found for these problems. Additionally, the need to reduce costs, reduce production time, improve efficiencies and performance, and meet competitive pressures, adds an even greater urgency to the critical necessity for finding answers to these problems.

Thus a need still remains for smaller footprints and more robust packages and methods for manufacture. Solutions to these problems have been long sought but prior developments have not taught or suggested any solutions and, thus, solutions to these problems have long eluded those skilled in the art.

DISCLOSURE OF THE INVENTION

The present invention provides an integrated circuit package-in-package system including: providing a substrate; mounting a structure over the substrate; supporting an inner stacking module cantilevered over the substrate by an electrical interconnect connected to the substrate, forming a gap between the inner stacking module and the structure controlled by the size of the electrical interconnect; and encapsulating the structure and inner stacking module with an encapsulation.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the drawing FIGs. Similarly, although the views in the drawings for ease of description generally show similar orientations, this depiction in the FIGs. is arbitrary for the most part. Generally, the invention can be operated in any orientation. In addition, where multiple embodiments are disclosed and described having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements.

The term "system" as used herein refers to and is defined as the method and as the apparatus of the present invention in accordance with the context in which the term is used.

Figure 1:
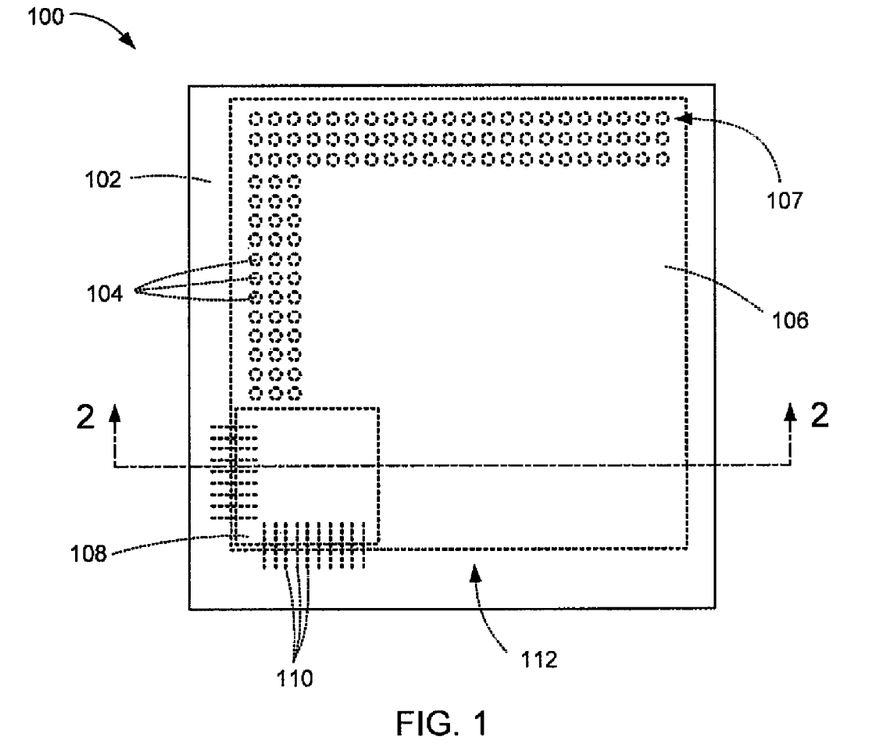
FIG. 1 is a top view of an integrated circuit package system, in a first embodiment of the present invention.

Referring now to FIG. 1, therein is shown a top view of an integrated circuit package system 100, in a first embodiment of the present invention. The top view depicts the integrated circuit package system 100, such as a flip-chip package-in-package (Fc-PIP), with a substrate 102, such as a laminated plastic or ceramic substrate.

Shown over the substrate 102 are electrical interconnects, such as solder balls 104, and more specifically, a group of inner stacking module (ISM) solder balls. The solder balls 104 electrically connect an ISM 106 to the substrate 102.

The solder balls 104 electrically connect the ISM 106 under two sides of the ISM 106 and in three rows 107 to the substrate 102. Mounted over the ISM 106 is a chip such as a wire-bonded (WB) chip 108. The WB chip 108 is mounted with adhesive and is then electrically connected to the substrate 102 with bond wires 110 along an edge 112 of the ISM 106.

Figure 2:
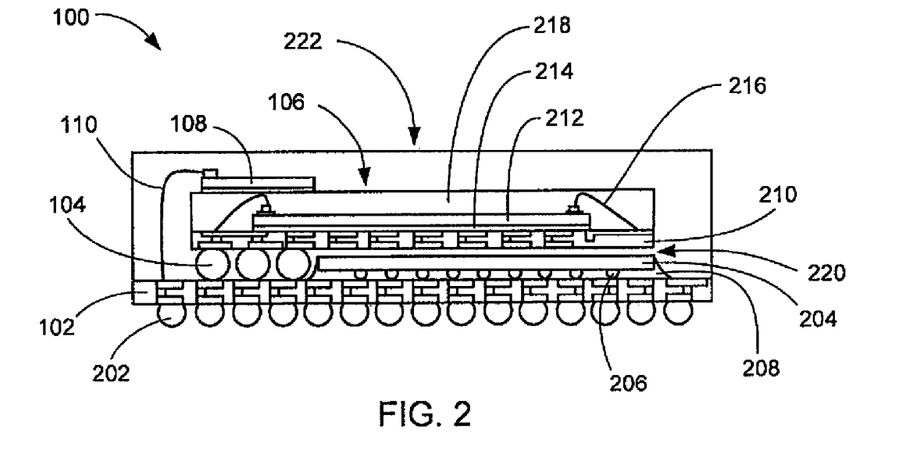
FIG. 2 is a cross sectional view of the integrated circuit package system along the line 2-2 of FIG. 1.

Referring now to FIG. 2, therein is shown a cross sectional view of the integrated circuit package system 100 along the line 2-2 of FIG. 1. The integrated circuit package system 100 includes external interconnects 202 attached under the substrate 102.

Between the substrate 102 and the ISM 106 is a structure such as a flip-chip (Fc) 204 or other chips. The Fc 204 is shown mounted and electrically interconnected to the substrate 102 with solder balls such as flip-chip (Fc) solder balls 206. Between the substrate 102 and the Fc 204 is an under-fill 208.

Above the substrate 102 and the Fc 204, the ISM 106 includes an ISM substrate 210. The ISM substrate 210, such as a laminated plastic or ceramic substrate, is electrically connected to the substrate 102 by the solder balls 104.

Above the ISM substrate 210 are one or more chips, such as an ISM chip 212. The ISM chip 212 is secured by an ISM adhesive 214 to the ISM substrate 210 and is electrically connected to the ISM substrate 210 with ISM bond wires 216. The ISM 106 has an ISM encapsulation 218, such as an epoxy mold compound (EMC), encapsulating the ISM chip 212 and the ISM bond wires 216.

Between the ISM 106 and the Fc 204 is a gap 220. The gap 220 is formed by cantilevering the ISM 106 over the Fc 204 during manufacture. This technique utilizes the solder balls 104 to support the ISM 106 over the Fe 204. Cantilever is defined as: "a projecting beam or member supported at only one end.

The solder balls 104 are depicted as uniformly sized but may differ in diameter. For example to ensure the ISM 106 remains parallel over the Fc 204, the solder balls 104 may be required to be larger near the gap 220 and smaller away from the gap 220. This may be increasingly important when the solder balls 104 connect the ISM 106 to the substrate 102 under only one side of the ISM 106.

The gap 220 size is controlled by changing the diameter of the solder balls 104 that connect the ISM 106 to the substrate 102. For example, larger solder balls 104 will produce a larger gap 220.

Above the substrate 102, is an encapsulation 222, such as an EMC. The encapsulation 222 provides mechanical protection and otherwise shields the ISM 106, the WB chip 108, and the Fc 204 from exposure to the environment.

The encapsulation 222 also fills the gap 220 between the ISM 106 and the Fc 204 in the integrated circuit package system 100.

Figure 3:
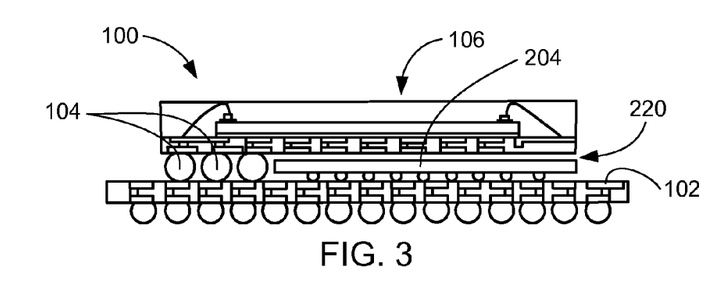
FIG. 3 is the structure of FIG. 2 in an intermediate mounting phase of manufacture.

Referring now to FIG. 3, therein is shown the structure of FIG. 2 in an intermediate mounting phase of manufacture. The intermediate mounting phase depicts the ISM 106 and the Fc 204 mounted to the substrate 102.

The solder balls 104 are used in this process step to control the gap 220 size and to support the ISM 106 over the Fc 204. It has been unexpectedly discovered that using the solder balls 104 to support the ISM 106 allows for the combining of multiple process steps saving valuable process time.

Figure 4:
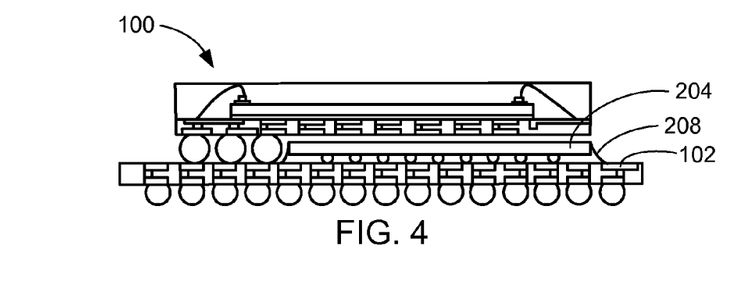
FIG. 4 is the structure of FIG. 3 in an under-filling phase of manufacture.

Referring now to FIG. 4, therein is shown the structure of FIG. 3 in an under-filling phase of manufacture. The under-filling phase depicts the under-fill 208 between the Fc 204 and the substrate 102.

Figure 5:
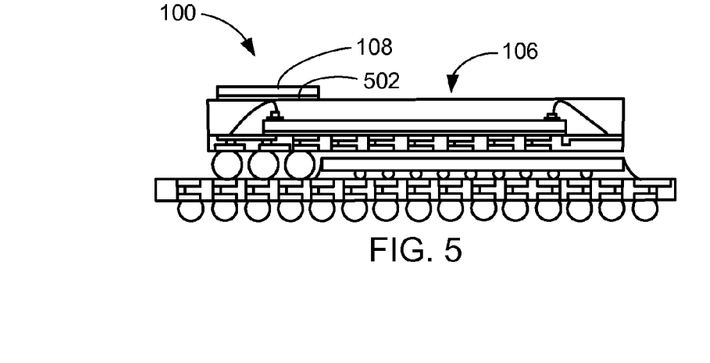
FIG. 5 is the structure of FIG. 4 in a die attach phase of manufacture.

Referring now to FIG. 5, therein is shown the structure of FIG. 4 in a die attach phase of manufacture. The die attach phase depicts the WB chip 108 mounted above the ISM 106, and attached by an adhesive 502.

Figure 6:
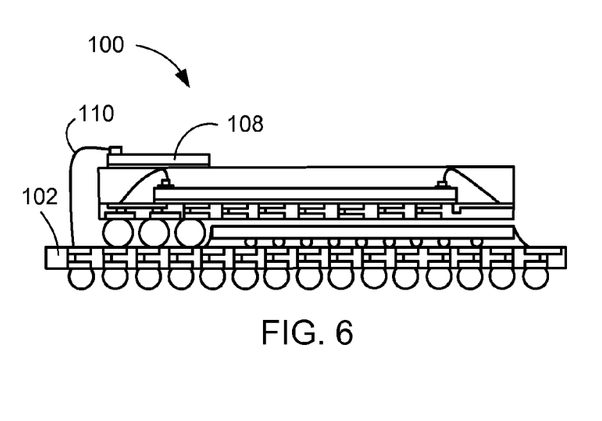
FIG. 6 is the structure of FIG. 5 in a wire bonding phase of manufacture.

Referring now to FIG. 6, therein is shown the structure of FIG. 5 in a wire bonding phase of manufacture. The wire bonding phase depicts the WB chip 108 electrically connected to the substrate 102 by the bond wires 110.

Figure 7:
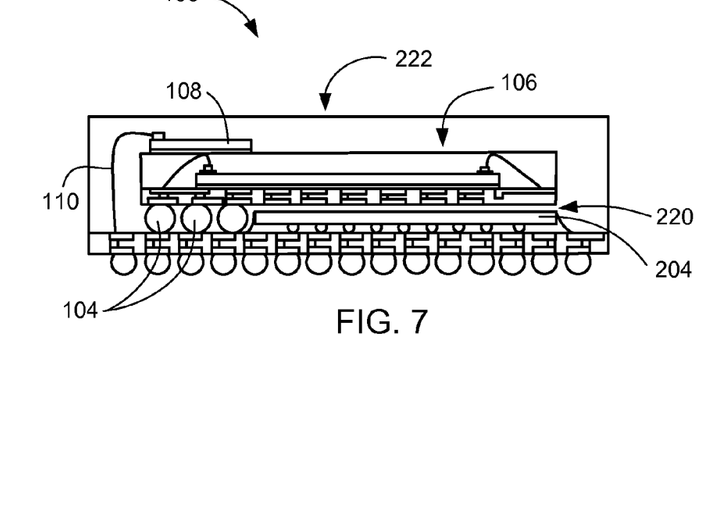
FIG. 7 is the structure of FIG. 6 in a molding phase of manufacture.

Referring now to FIG. 7, therein is shown the structure of FIG. 6 in a molding phase of manufacture. The molding phase depicts the encapsulation 222 encapsulating the ISM 106, the WB chip 108, the bond wires 110, and the solder balls 104. The encapsulation 222 also fills the gap 220 between the ISM 106 and the Fc 204.

Figure 8:
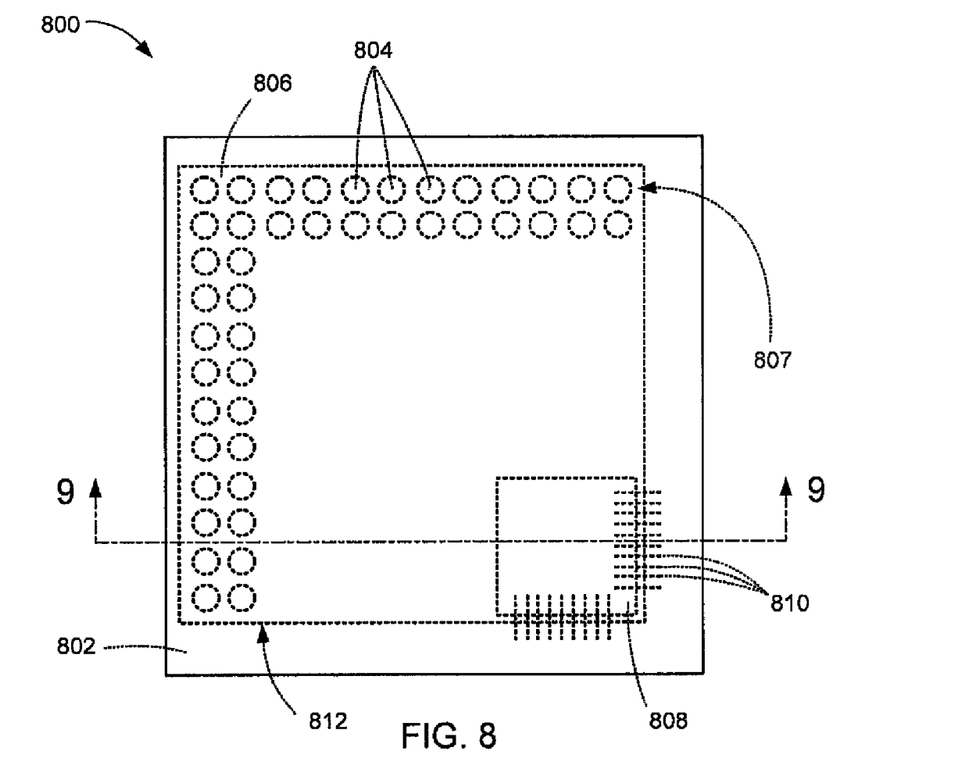
FIG. 8 is a top view of an integrated circuit package system, in a second embodiment of the present invention.

Referring now to FIG. 8, therein is shown a top view of an integrated circuit package system 800, in a second embodiment of the present invention. The top view depicts the integrated circuit package system 800, such as a PIP, with a substrate 802, such as a laminated plastic or ceramic substrate.

Shown over the substrate 802 are electrical interconnects, such as solder balls 804, and more specifically, a group of ISM solder balls. The solder balls 804 electrically connect an ISM 806 to the substrate 802.

The solder balls 804 electrically connect the ISM 806 under two sides of the ISM 806 and in two rows 807 to the substrate 802.

Mounted over the ISM 806 is a chip such as a WB chip 808. The WB chip 808 is mounted with adhesive and is then electrically connected to the substrate 802 with bond wires 810 along an edge 812 of the ISM 806.

Figure 9:
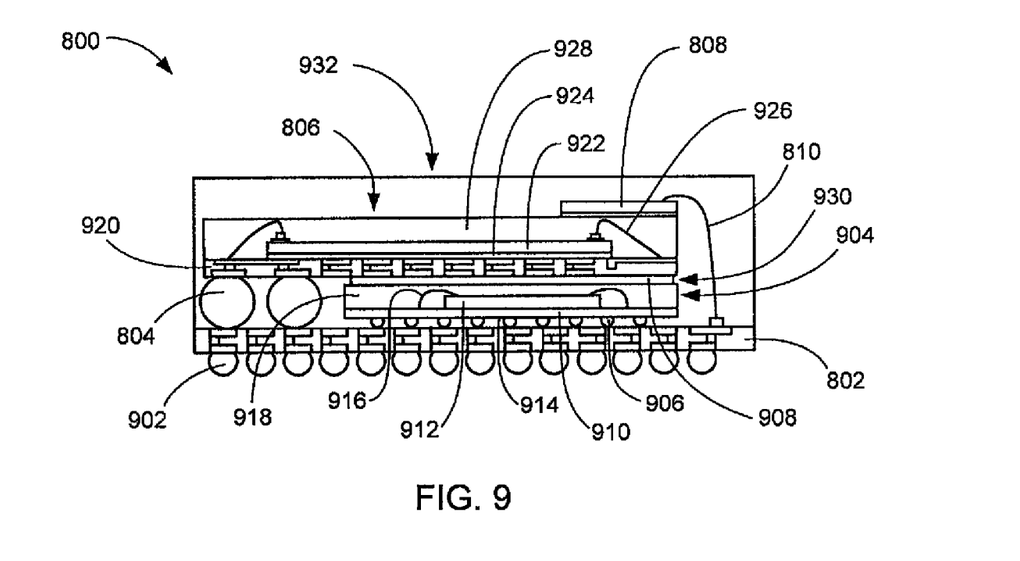
FIG. 9 is a cross sectional view of the integrated circuit package system along the line 9-9 of FIG. 8.

Referring now to FIG. 9, therein is shown a cross sectional view of the integrated circuit package system 800 along the line 9-9 of FIG. 8. The integrated circuit package system 800 includes external interconnects 902 attached under the substrate 802.

Between the substrate 802 and the ISM 806 is a structure such as a lower inner stacking module (LISM) 904. The LISM 904 is shown mounted and electrically interconnected to the substrate 802 with solder balls such as LISM solder balls 906.

Above the LISM 904 is an under-fill 908. The LISM 904 includes an LISM substrate 910. The LISM substrate 910, such as a laminated plastic or ceramic substrate, is electrically connected to the substrate 802 by the LISM solder balls 906.

Above the LISM substrate 910, an LISM chip 912 is mounted and secured by an LISM adhesive 914 to the LISM substrate 910. The LISM chip 912 is electrically connected to the LISM substrate 910 with LISM bond wires 916. The LISM 904 has an LISM encapsulation 918, such as an EMC. The LISM encapsulation 918 encapsulates the LISM chip 912 and the LISM bond wires 916.

Above the substrate 802 and the LISM 904, the ISM 806 is similarly shown having an ISM substrate 920. The ISM substrate 920, such as a laminated plastic or ceramic substrate, is electrically connected to the substrate 802 by the solder balls 804.

Above the ISM substrate 920 are one or more chips, such as an ISM chip 922. The ISM chip 922 is secured by an ISM adhesive 924 to the ISM substrate 920 and is electrically connected to the ISM substrate 920 with ISM bond wires 926. The ISM 806 has an ISM encapsulation 928, such as an EMC, encapsulating the ISM chip 922 and the ISM bond wires 926.

Between the ISM 806 and the LISM 904 is a gap 930. The gap 930 is formed by cantilevering the ISM 806 over the LISM 904 during manufacture. This technique utilizes the solder balls 804 to support the ISM 806 over the LISM 904.

The gap 930 size is controlled by changing the diameter of the solder balls 804 that connect the ISM 806 to the substrate 802. For example, larger solder balls 804 will produce a larger gap 930. The gap 930, in the integrated circuit package system 800 is filled with the under-fill 908.

Above the substrate 802, is an encapsulation 932, such as an EMC. The encapsulation 932 provides mechanical protection and otherwise shields the ISM 806, the WB chip 808, and the LISM 904 from exposure to the environment. The encapsulation 932 also fills between the LISM 904 and the substrate 802.

Figure 10:
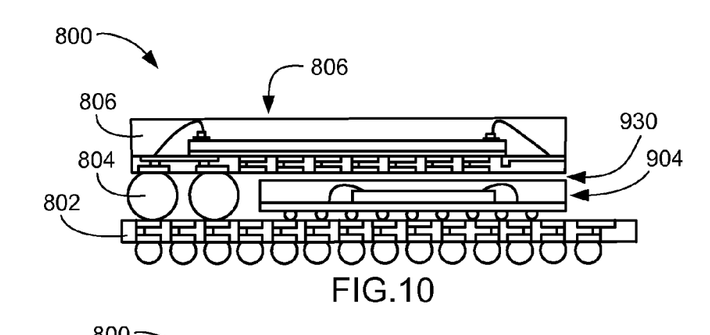
FIG. 10 is the structure of FIG. 9 in an intermediate mounting phase of manufacture.

Referring now to FIG. 10, therein is shown the structure of FIG. 9 in an intermediate mounting phase of manufacture. The intermediate mounting phase depicts the ISM 806 and the LISM 904 mounted to the substrate 802.

The solder balls 804 are used in this process step to control the gap 930 size and to support the ISM 806 over the LISM 904. It has been unexpectedly discovered that using the solder balls 804 to support the ISM 806 allows for the combining of multiple process steps saving valuable process time.

Figure 11:
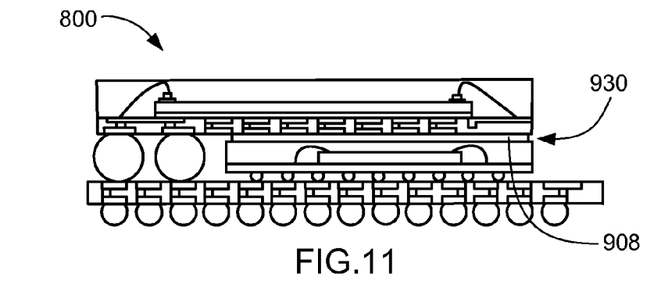
FIG. 11 is the structure of FIG. 10 in an under-filling phase of manufacture.

Referring now to FIG. 11, therein is shown the structure of FIG. 10 in an under-filling phase of manufacture. The under-filling phase depicts the under-fill 908 is shown filling the gap 930.

Figure 12:
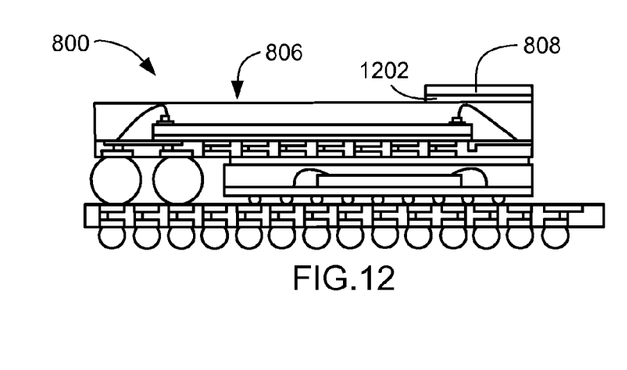
FIG. 12 is the structure of FIG. 11 in a die attach phase of manufacture.

Referring now to FIG. 12, therein is shown the structure of FIG. 11 in a die attach phase of manufacture. The die attach phase depicts the WB chip 808 mounted above the ISM 806, and attached by an adhesive 1202.

Figure 13:
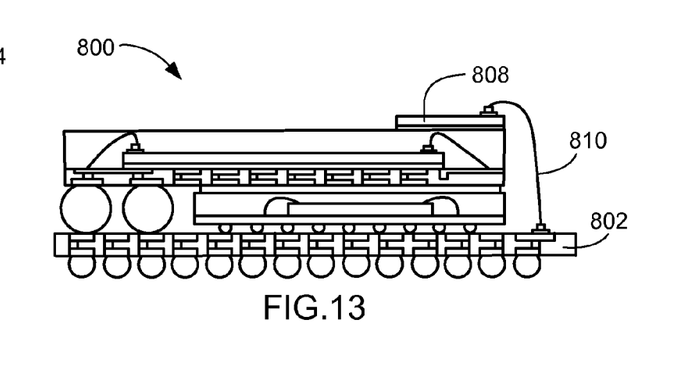
FIG. 13 is the structure of FIG. 12 in a wire bonding phase of manufacture.

Referring now to FIG. 13, therein is shown the structure of FIG. 12 in a wire bonding phase of manufacture. The wire bonding phase depicts the WB chip 808 electrically connected to the substrate 802 by the bond wires 810.

Figure 14:
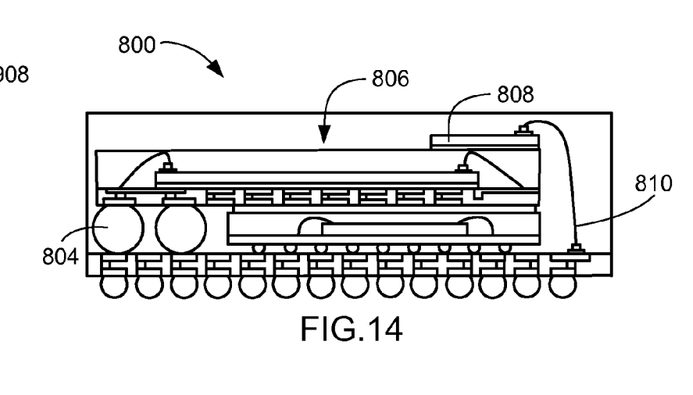
FIG. 14 is the structure of FIG. 13 in a molding phase of manufacture.

Referring now to FIG. 14, therein is shown the structure of FIG. 13 in a molding phase of manufacture. The molding phase depicts the encapsulation 932 encapsulating the ISM 806, the WB chip 808, the bond wires 810, and the solder balls 804.

Figure 15:
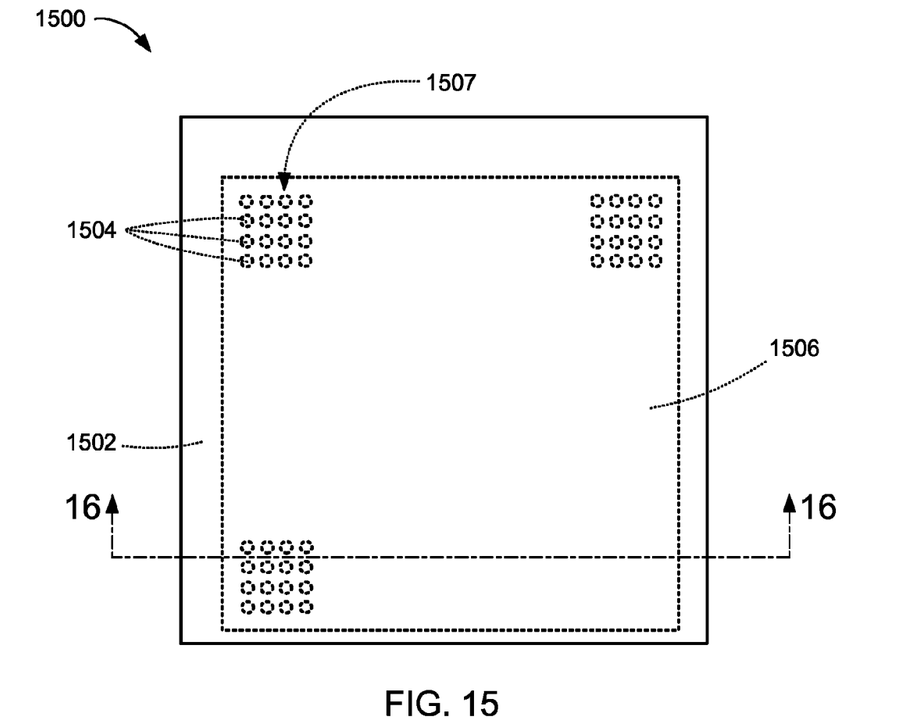
FIG. 15 is a top view of an integrated circuit package system, in a third embodiment of the present invention.

Referring now to FIG. 15, therein is shown a top view of an integrated circuit package system 1500, in a third embodiment of the present invention. The top view depicts the integrated circuit package system 1500, such as a WB-PIP, with a substrate 1502, such as a laminated plastic or ceramic substrate.

Shown over the substrate 1502 are electrical interconnects, such as solder balls 1504, and more specifically groups of ISM solder balls 1507. The solder balls 1504 electrically connect an ISM 1506 to the substrate 1502.

The solder balls 1504 electrically connect the ISM 1506 under two sides of the ISM 1506, in three groups, each having four rows and four columns, to the substrate 1502.

Figure 16:
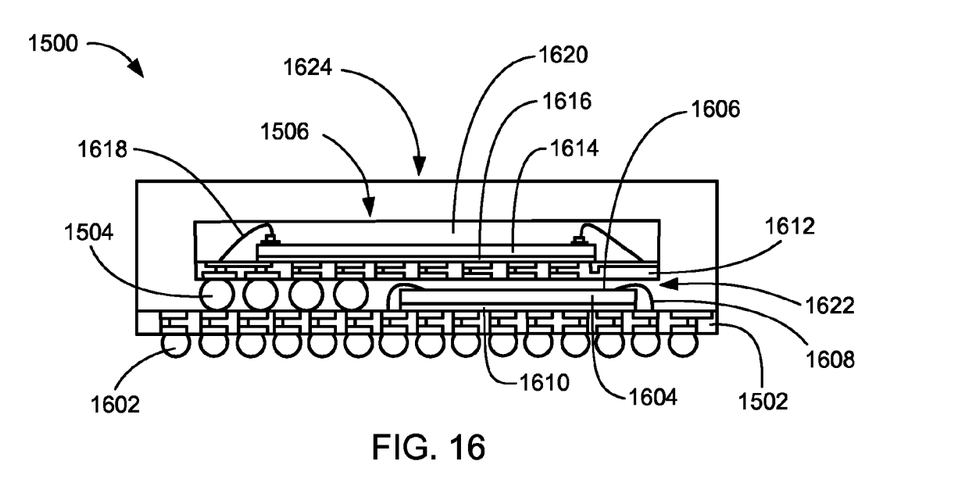
FIG. 16 is a cross sectional view of the integrated circuit package system along the line 16-16 of FIG. 15.

Referring now to FIG. 16, therein is shown a cross sectional view of the integrated circuit package system 1500 along the line 16-16 of FIG. 15. The integrated circuit package system 1500 includes external interconnects 1602 attached under the substrate 1502.

Between the substrate 1502 and the ISM 1506 is a structure such as a WB chip 1604, with an active side 1606. The WB chip 1604 is shown electrically interconnected to the substrate 1502 by interconnects such as bond wires 1608 attaching to the active side 1606. The WB chip 1604 is attached to the substrate 1502 with a die attach adhesive 1610.

Above the substrate 1502 and the WB chip 1604, the ISM 1506 includes an ISM substrate 1612. The ISM substrate 1612, such as a laminated plastic or ceramic substrate, is electrically connected to the substrate 1502 by the solder balls 1504.

Above the ISM substrate 1612 are one or more chips, such as an ISM chip 1614. The ISM chip 1614 is secured by an ISM adhesive 1616 to the ISM substrate 1612 and is electrically connected to the ISM substrate 1612 with ISM bond wires 1618. The ISM 1506 has an ISM encapsulation 1620, such as an EMC, encapsulating the ISM chip 1614 and the ISM bond wires 1618.

Between the ISM 1506 and the WB chip 1604 is a gap 1622. The gap 1622 is formed by cantilevering the ISM 1506 over the WB chip 1604 during manufacture. This technique utilizes the solder balls 1504 to support the ISM 1506 over the WB chip 1604.

The gap 1622 size is controlled by changing the diameter of the solder balls 1504 that connect the ISM 1506 to the substrate 1502. For example, larger solder balls 1504 will produce a larger gap 1622.

Above the substrate 1502, is an encapsulation 1624, such as an EMC. The encapsulation 1624 provides mechanical protection and otherwise shields the ISM 1506, and the WB chip 1604 from exposure to the environment. The encapsulation 1624 also fills the gap.

Figure 17:
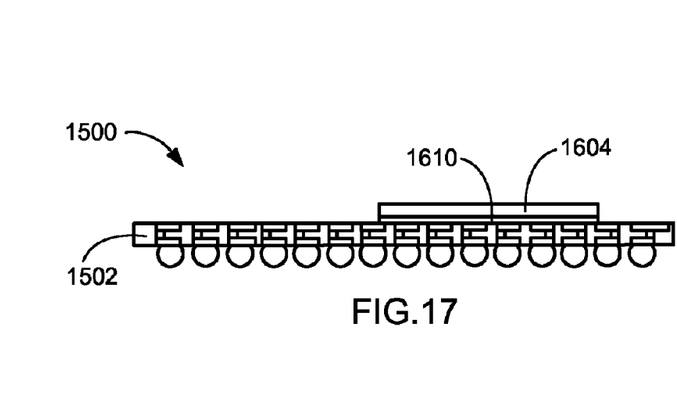
FIG. 17 is the structure of FIG. 16 in an intermediate first mounting phase of manufacture.

Referring now to FIG. 17, therein is shown the structure of FIG. 16 in an intermediate first mounting phase of manufacture. The intermediate first mounting phase depicts the WB chip 1604 mounted to the substrate 1502 with the die attach adhesive 1610.

Figure 18:
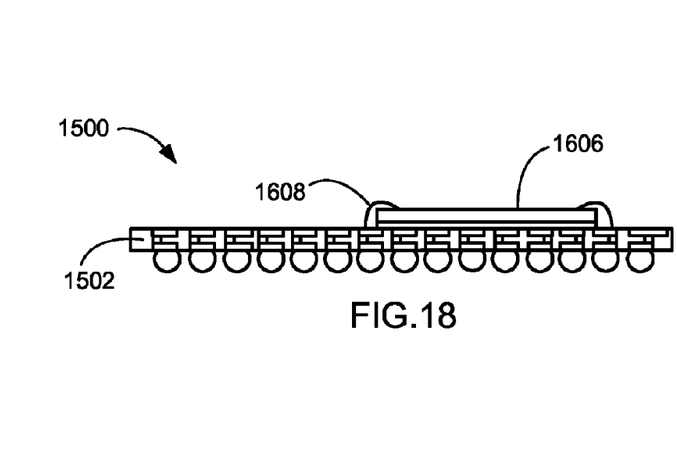
FIG. 18 is the structure of FIG. 17 in a wire bonding phase of manufacture.

Referring now to FIG. 18, therein is shown the structure of FIG. 17 in a wire bonding phase of manufacture. The wire bonding phase depicts the bond wires 1608 attached to the active side 1606 and electrically connecting the active side 1606 to the substrate 1502.

Figure 19:
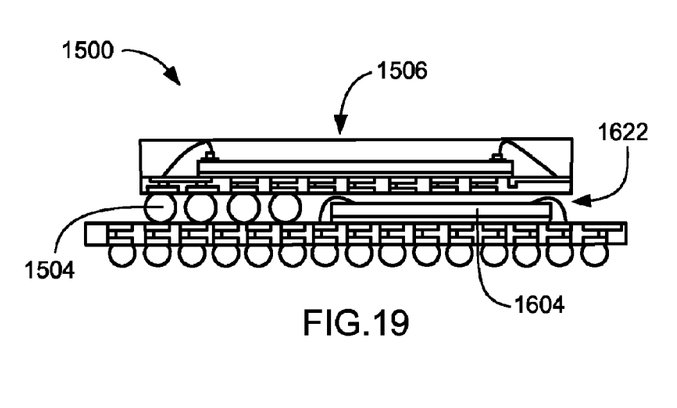
FIG. 19 is the structure of FIG. 18 in a second mounting phase of manufacture.

Referring now to FIG. 19, therein is shown the structure of FIG. 18 in a second mounting phase of manufacture. The second mounting phase depicts the ISM 1506 mounted to the substrate 1502 and supported over the WB chip 1604 with the solder balls 1504.

The solder balls 1504 are used in this process step to control the gap 1622 size and to support the ISM 1506 over the WB chip 1604. It has been unexpectedly discovered that using the solder balls 1504 to support the ISM 1506 allows for the combining of multiple process steps saving valuable process time.

Figure 20:
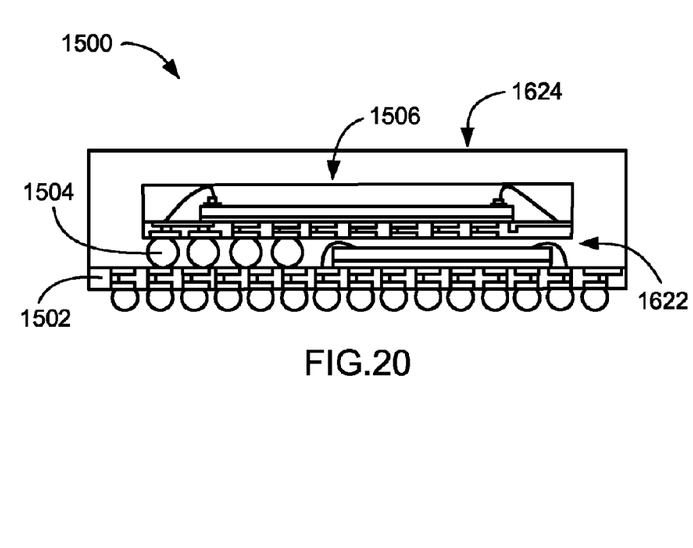
FIG. 20 is the structure of FIG. 19 in a molding phase of manufacture.

Referring now to FIG. 20, therein is shown the structure of FIG. 19 in a molding phase of manufacture. The molding phase depicts the encapsulation 1624 encapsulating the ISM 1506, the bond wires 1510, and the solder balls 1504. The encapsulation 1624 also fills the gap 1622 in this molding phase.

Figure 21:
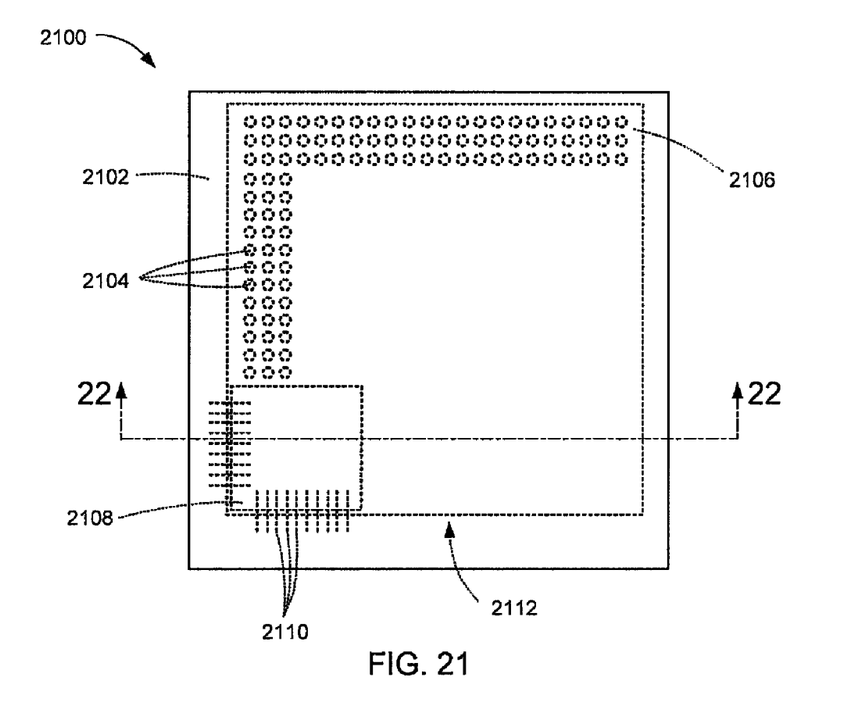
FIG. 21 is a top view of an integrated circuit package system, in a fourth embodiment of the present invention.

Referring now to FIG. 21, therein is shown a top view of an integrated circuit package system 2100, in a fourth embodiment of the present invention. The top view depicts the integrated circuit package system 2100, such as a WB-PIP, with a substrate 2102, such as a laminated plastic or ceramic substrate.

Shown over the substrate 2102 are electrical interconnects, such as solder balls 2104, and more specifically, a group of ISM solder balls. The solder balls 2104 electrically connect an ISM 2106 to the substrate 2102.

The solder balls 2104 electrically connect the ISM 2106 under two sides of the ISM 2106, in three rows. Mounted over the ISM 2106 is a chip such as a WB chip 2108. The WB chip 2108 is mounted with adhesive and is then electrically connected to the substrate 2102 with bond wires 2110 along an edge 2112 of the ISM 2106.

Figure 22:
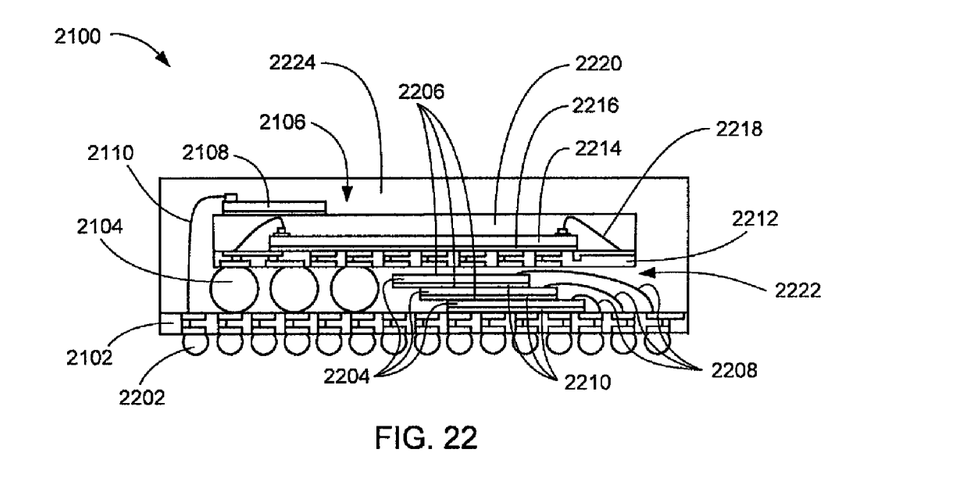
FIG. 22 is a cross sectional view of the integrated circuit package system along the line 22-22 of FIG. 21.

Referring now to FIG. 22, therein is shown a cross sectional view of the integrated circuit package system 2100 along the line 22-22 of FIG. 21. The integrated circuit package system 2100 includes external interconnects 2202 attached under the substrate 2102.

Between the substrate 2102 and the ISM 2106 is a structure such as multiple WB die 2204, with active sides 2206. The multiple WB die 2204 are shown electrically interconnected to the substrate 2102 by interconnects such as bond wires 2208 attaching to the active sides 2206. The multiple WB die 2204 are attached to the substrate 2102 with a die attach adhesive 2210.

Above the substrate 2102 and the multiple WB die 2204, the ISM 2106 includes an ISM substrate 2212. The ISM substrate 2212, such as a laminated plastic or ceramic substrate, is electrically connected to the substrate 2102 by the solder balls 2104.

Above the ISM substrate 2212 are one or more chips, such as an ISM chip 2214. The ISM chip 2214 is secured by an ISM adhesive 2216 to the ISM substrate 2212 and is electrically connected to the ISM substrate 2212 with ISM bond wires 2218. The ISM 2106 has an ISM encapsulation 2220, such as an EMC, encapsulating the ISM chip 2214 and the ISM bond wires 2218.

Between the ISM 2106 and the multiple WB die 2204 is a gap 2222. The gap 2222 is formed by cantilevering the ISM 2106 over the multiple WB die 2204 during manufacture. This technique utilizes the solder balls 2104 to support the ISM 2106 over the multiple WB die 2204.

The gap 2222 size is controlled by changing the diameter of the solder balls 2104 that connect the ISM 2106 to the substrate 2102. For example, larger solder balls 2104 will produce a larger gap 2222.

Above the substrate 2102, is an encapsulation 2224, such as an EMC. The encapsulation 2224 provides mechanical protection and otherwise shields the ISM 2106, and the multiple WB die 2204 from exposure to the environment. The encapsulation 2224 also fills the gap 2222.

Figure 23:
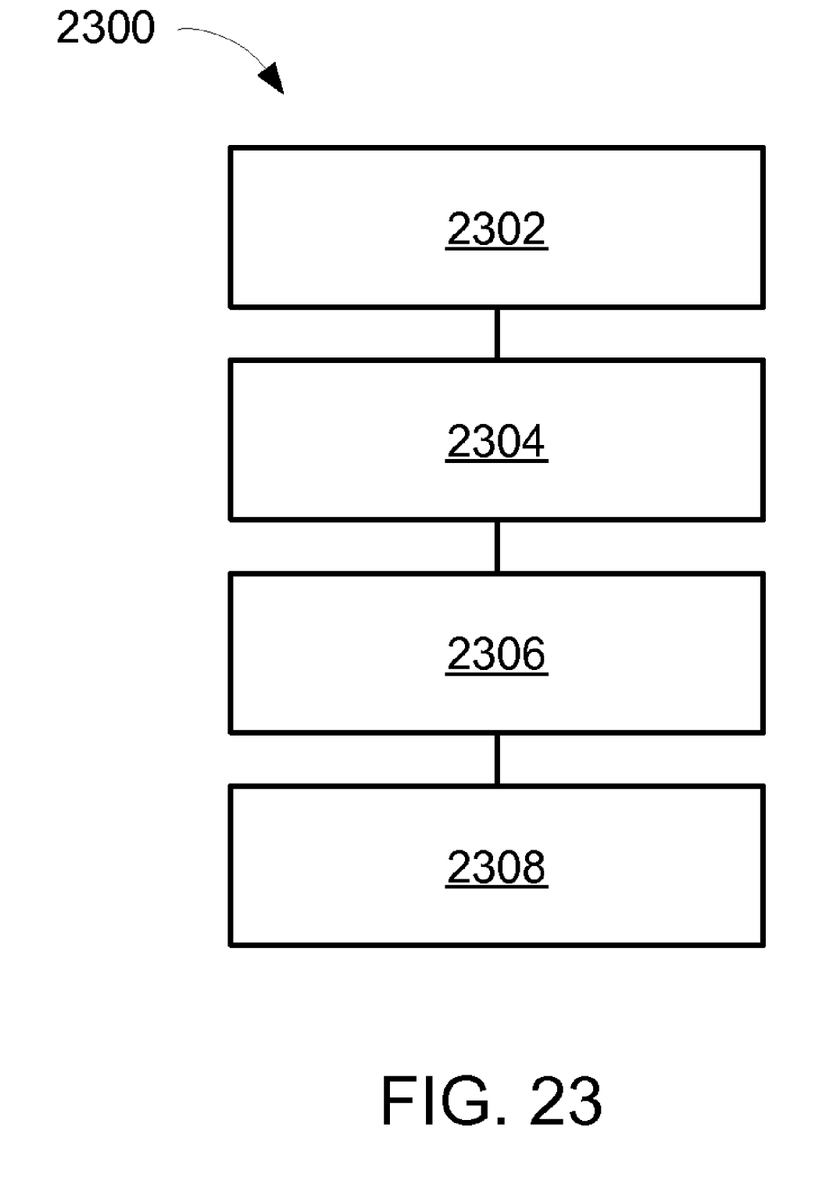
FIG. 23 is a flow chart of a system for manufacturing an integrated circuit package-in-package system in an embodiment of the present invention in an embodiment of the present invention.

Referring now to FIG. 23, therein is shown a flow chart of a system 2300 for an integrated circuit package-in-package system in an embodiment of the present invention. The system 2300 includes providing a substrate in a block 2302; mounting a structure over the substrate in a block 2304; supporting an inner stacking module cantilevered over the substrate by an electrical interconnect connected to the substrate, the electrical interconnect forming a gap between the inner stacking module and the structure controlled by the size of the electrical interconnect in a block 2306; and encapsulating the flip-chip and inner stacking module with an encapsulation in a block 2308.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method for manufacturing an integrated circuit package-in-package system comprising:
    providing a substrate;
    mounting a structure over the substrate;
    supporting an inner stacking module cantilevered over the substrate by an electrical interconnect connected to the substrate, the electrical interconnect forming a gap between the inner stacking module and the structure controlled by the size of the electrical interconnect;
    mounting a chip over and along an edge of the inner stacking module;
    electrically connecting bond wires between the chip and the substrate; and
    encapsulating the structure and inner stacking module with an encapsulation.

2. The method as claimed in claim 1 further comprising: filling the gap with under-fill.

3. The method as claimed in claim 1 wherein:
    encapsulating includes filling the gap with the encapsulation.

4. The method as claimed in claim 1 wherein:
    mounting a structure over the substrate includes attaching the structure to the substrate with a solder ball; and
    further comprising:
        filling between the structure and the substrate with under-fill.

5. The method as claimed in claim 1 wherein:
    mounting a structure over the substrate includes attaching the structure to the substrate with a solder ball; and
    encapsulating includes filling between the substrate and the structure with encapsulation.

6. A method for manufacturing an integrated circuit package-in-package system comprising:
    providing a substrate;
    mounting a structure over the substrate;
    supporting an inner stacking module cantilevered over the substrate by groups of solder balls connected to the substrate under no more than two sides of the inner stacking module, the solder balls forming a gap between the inner stacking module and the structure controlled by varying the size of the solder ball;
    mounting a chip over and along an edge of the inner stacking module;
    electrically connecting bond wires between the chip and the substrate; and
    encapsulating the structure and inner stacking module with an encapsulation.

7. The method as claimed in claim 6 wherein:
    mounting the structure over the substrate includes mounting a wire bond chip over the substrate.

8. The method as claimed in claim 6 wherein:
    mounting the structure over the substrate includes mounting a lower inner stacking module over the substrate.

9. The method as claimed in claim 6 wherein:
    mounting the structure over the substrate includes mounting a flip-chip over the substrate.

10. The method as claimed in claim 6 wherein:
    mounting the structure over the substrate includes mounting multiple wire bonded die over the substrate.

11. An integrated circuit package-in-package system comprising:
    a substrate;
    a structure mounted over the substrate;
    an inner stacking module cantilevered over the substrate by an electrical interconnect connected to the substrate, where the electrical interconnect forms a gap between the inner stacking module and the structure controlled by the size of the electrical interconnect;
    a chip mounted over and along an edge of the inner stacking module;
    bond wires between the chip and the substrate; and
    an encapsulation encapsulating the structure and inner stacking module.

12. The system as claimed in claim 11 wherein:
    the gap filled with under-fill.

13. The system as claimed in claim 11 wherein:
    the gap is filled with the encapsulation.

14. The system as claimed in claim 11 wherein:
    the structure is attached to the substrate with a second solder ball; and
    further comprising:
        an underfill between the structure and the substrate.

15. The system as claimed in claim 11 wherein:
    the structure is attached to the substrate with a second solder ball; and
    the encapsulation is between the substrate and the structure.

16. The system as claimed in claim 11 wherein:
    the electrical interconnect is a solder ball; and
    the inner stacking module cantilevered over the structure by groups of solder balls connected to the substrate under no more than two sides of the inner stacking module.

17. The system as claimed in claim 16 wherein:
    the structure mounted over the substrate is a wire bond chip.

18. The system as claimed in claim 16 wherein:
    the structure mounted over the substrate is a lower inner stacking module.

19. The system as claimed in claim 16 wherein:
    the structure mounted over the substrate is a flip-chip.

20. The system as claimed in claim 16 wherein:
    The structure mounted over the substrate is a multiple wire bonded die.

* * * * *